United States Patent [19]
Berkcan

[11] Patent Number: 5,463,313
[45] Date of Patent: Oct. 31, 1995

[54] REDUCED MAGNETIC FIELD LINE INTEGRAL CURRENT SENSOR

[75] Inventor: Ertugrul Berkcan, Schenectady, N.Y.

[73] Assignee: General Electric Company, Schenectady, N.Y.

[ * ] Notice: The term of this patent shall not extend beyond the expiration date of Pat. No. 5,459,395.

[21] Appl. No.: 119,269

[22] Filed: Sep. 9, 1993

[51] Int. Cl.⁶ .......................... G01R 33/02; G01R 19/00
[52] U.S. Cl. ...................................... 324/117 R; 324/126
[58] Field of Search .................................. 324/126–127, 324/244

[56] References Cited

U.S. PATENT DOCUMENTS

| | | | |
|---|---|---|---|
| 2,831,164 | 4/1958 | Johnson | 324/127 |
| 3,372,334 | 3/1968 | Fenoglio et al. | 324/126 |
| 3,665,357 | 5/1972 | Tsubouchi et al. | 336/73 |
| 3,921,069 | 11/1975 | Milkovic | 324/107 |
| 3,995,210 | 11/1976 | Milkovic | 324/94 H |
| 4,140,961 | 2/1979 | Akamatsu | 323/6 |
| 4,182,982 | 1/1980 | Wolf et al. | 324/127 |
| 4,240,059 | 12/1980 | Wolf et al. | 338/49 |
| 4,255,704 | 3/1981 | Milkovic | 324/127 |
| 4,255,705 | 3/1981 | Milkovic | 324/127 |
| 4,278,940 | 7/1981 | Milkovic | 324/127 |
| 4,286,214 | 8/1981 | Milkovic | 324/142 |
| 4,414,510 | 11/1983 | Milkovic | 324/252 |
| 4,492,919 | 1/1985 | Milkovic | 324/127 |
| 4,494,068 | 1/1985 | Ley et al. | 324/126 |
| 4,495,463 | 1/1985 | Milkovic | 324/142 |
| 4,513,274 | 4/1985 | Halder | 336/173 |
| 4,539,521 | 9/1985 | Matsumoto | 324/244 |
| 4,580,095 | 4/1986 | DeVries | 324/126 |
| 4,626,778 | 12/1986 | Friedl | 324/127 |
| 4,684,827 | 8/1987 | Ohms | 307/413 |
| 4,794,326 | 12/1988 | Friedl | 324/117 |
| 4,810,989 | 3/1989 | Brandenberg et al. | 336/84 |
| 4,835,463 | 5/1989 | Baran et al. | 324/123 |
| 4,894,610 | 1/1990 | Friedl | 324/127 |
| 4,912,396 | 3/1990 | Groenenboom | 324/117 R |
| 4,939,451 | 7/1990 | Baran et al. | 324/127 |
| 4,947,107 | 8/1990 | Doerfler et al. | 324/96 |
| 4,999,692 | 3/1991 | Ristic et al. | 357/127 |
| 5,027,059 | 6/1991 | de Montgolfier et al. | 324/127 |
| 5,066,904 | 11/1991 | Bullock | 324/127 |

OTHER PUBLICATIONS

"Faraday Effect Sensors: The State of the Art," GW Day, A. H. Rose, SPIE Vo. 985, Fiber Optic and Laser Sensors VI (1988), pp. 138–150.

"Integrated Semiconductor Magnetic Field Sensors," Henry P. Baltes, Proceedings of the IEEE, vol. 74, No. 8, Aug. 1986, pp. 1107–1132.

"GE Type EV and Phase3 Meters, Signal Conditioning and Scaling," Donald F. Bullock, David D. Elmore, GE Meter & Control Business, Somersworth, NH 03878, Mar. 1991.

"Differential Current Sensing Method and Apparatus," Ser. No. 08/043,903, Filed Apr. 7, 1993.

"Electrical Measurements" From Electrical Engineering Texts by Frank A. Laws, Mass. Institute of Tech. 1938, pp. 72–75.

Primary Examiner—Kenneth A. Wieder
Assistant Examiner—Barry C. Bowser
Attorney, Agent, or Firm—Enrique J. Mora; Marvin Snyder

[57] ABSTRACT

A current sensor for measuring a primary electrical current inducing a primary magnetic field defined over a known region includes a first sensor unit for measuring the line integral of the primary magnetic field along a first predetermined path included within the known region; and a second sensor unit for measuring the line integral of the primary magnetic field along a second predetermined path within the known region, the line integral of the primary magnetic field measured by the second sensor unit being a predetermined calibrated amount different from the line integral of the primary magnetic field measured by the first sensor unit. The current sensor further includes a current source for generating a current inducing a magnetic field to partially offset the difference between the line integral of the primary magnetic field measured by the first sensor unit and the line integral of the primary magnetic field measured by the second sensor unit.

26 Claims, 3 Drawing Sheets fig. 1 fig. 2

REDUCED MAGNETIC FIELD LINE INTEGRAL CURRENT SENSOR

RELATED APPLICATIONS

This application is related to patent application Ser. No. 08/119,267 entitled "Reduced Magnetic Flux Current Sensor," by Berkcan, filed Sep. 9, 1993, patent application Ser. No. 08/085,789 entitled "Reduced Time Rate of Change Magnetic Flux Current Sensor," by Berkcan, filed Jul. 6, 1993, patent application Ser. No. 08/085,787 entitled "Non-inductive Shunt Current Sensor," by Berkcan, filed Jul. 6, 1993, patent application Ser. No. 08/085,790 entitled "Current Sensor Employing a Mutually Inductive Current Sensing Scheme with a Magnetic Field Substantially Uniform in Angular Direction," by Berkcan et al., filed Jul. 6, 1993, and patent application Ser. No. 08/085,788 entitled "Current Sensor Employing a Mutually Inductive Current Sensing Scheme," by Berkcan et al., filed Jul. 6, 1993, all of the foregoing assigned to the assignee of the present invention and herein incorporated by reference.

FIELD OF THE INVENTION

This invention relates to current sensors and, more particularly, to a current sensor that measures current based on measuring the line integral, along a predetermined path, of the magnetic field due to the current to be measured or sensed.

BACKGROUND OF THE INVENTION

Current sensors, such as U.S. Pat. No. 5,066,904, entitled "Coaxial Current Sensors," by Bullock, issued Nov. 19, 1991, assigned to the assignee of the present invention and herein incorporated by reference, are known in the art. These sensors, although useful, suffer from some disadvantages including the need for a current shunt to help reduce the expense of the current sensor by reducing the number of ampere-turns in the active part of the current sensor while still obtaining an accurate measurement of the current. Furthermore, even the use of an accurate current shunt typically introduces some expense due to the current sensor materials needed, such as low temperature coefficient materials, the large number of coil "turns" in the sensing and feedback coils of the current shunt, as well as the manufacturing care required to fabricate the current sensor. Thus, a need exists for a current sensor that overcomes these problems.

SUMMARY OF THE INVENTION

One object of the invention is to provide a current sensor based on measuring the line integral, along a predetermined path, of the magnetic field due to the current to be sensed.

Another object of the invention is to provide a current sensor that eliminates the need for a current shunt.

Briefly, in accordance with one embodiment of the invention, a current sensor for measuring a primary electrical current inducing a primary magnetic field defined over a known region comprises: a first sensor unit for measuring the line integral of the primary magnetic field along a first predetermined path included within the known region; and a second sensor unit for measuring the line integral of the primary magnetic field along a second predetermined path included within the known region, the line integral of the primary magnetic field measured along the second path by the second sensor unit being a predetermined calibrated amount different from the line integral of the primary magnetic field measured along the first path by the first sensor unit. The current sensor may further include a current source for generating a current inducing a magnetic field or magnetic flux density within the known region to at least partially offset the calibrated difference between the line integral of the primary magnetic field along the first path measured by the first sensor unit and the line integral of the primary magnetic field along the second path measured by the second sensor unit.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may be best be understood by reference to the following detailed description when read with the accompanying drawings in which:

DETAILED DESCRIPTION OF THE INVENTION

Figure 1:
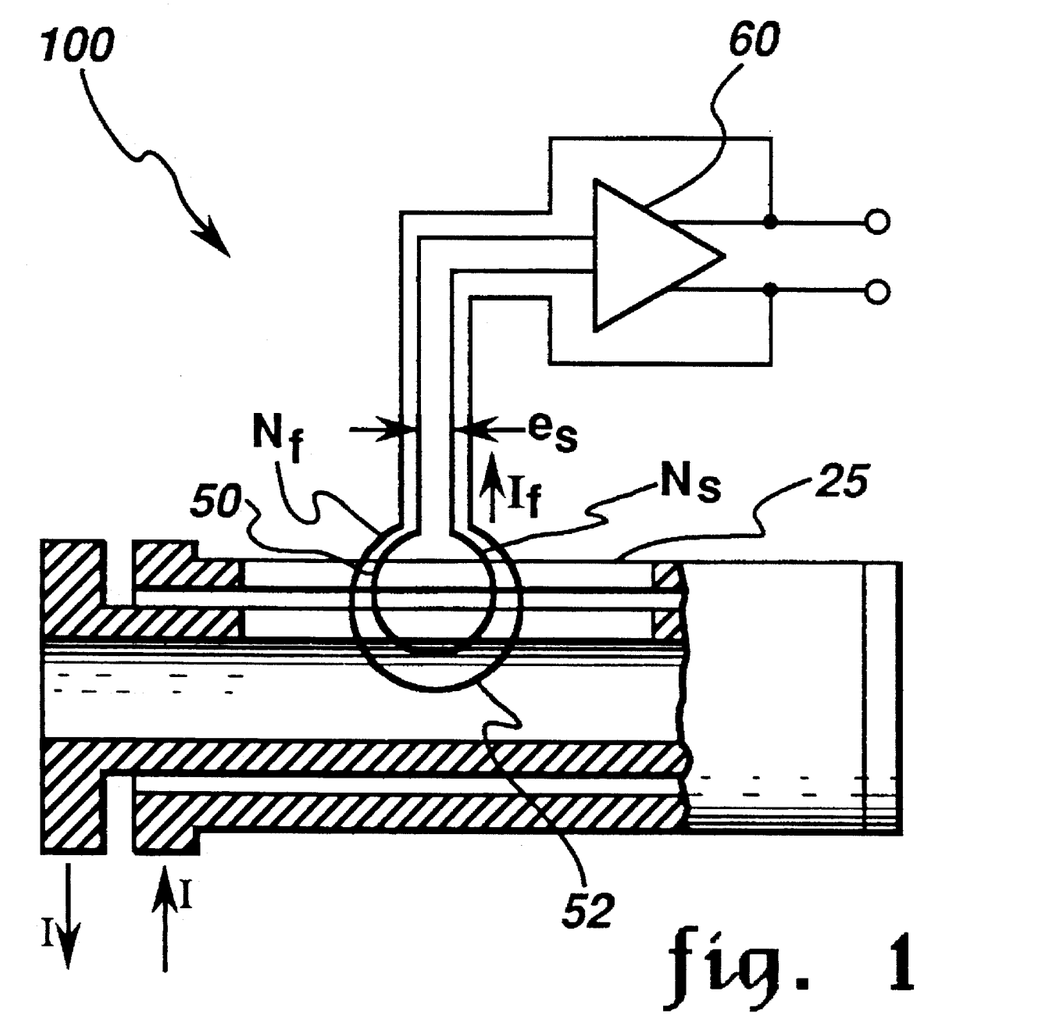
FIG. 1 is a schematic diagram of an embodiment of a magnetic flux cancelling current sensor.

FIG. 1 illustrates an embodiment of a current sensor 100 in which magnetic flux cancelling occurs. In general, the use of such a current sensing scheme entails supplying an ampere-current equal, but opposite, to the changes in magnetic flux due to the primary electrical current through the current sensor to be measured. In the context of the invention, changes in magnetic flux refers to the time rate of change of magnetic flux, magnetic flux refers to the integral of the magnetic induction over a predetermined area, and the line integral of the magnetic field refers to the integral of the magnetic induction along a predetermined path.

For the current sensor illustrated in FIG. 1, a magnetic field substantially uniform in angular direction and, thus, having substantially parallel magnetic field lines is present between two conductive hollow cylinders comprising the current sensor, such as one of the type illustrated in patent application Ser. No. 08/085,790. The direction of current flow through the sensor is illustrated by arrows, although the sensor may also accommodate current flow in an opposing direction. As illustrated, a slot or opening 25 in the cylinders provides access to the magnetic field for a sensor or element for sensing changes in magnetic flux, such as a conductive coil. The primary electrical current through the current sensor induces a magnetic field having a magnetic flux density substantially defined over a known area, such as the cross-sectional area of the current sensor. In the context of the present invention, the terms magnetic flux density and magnetic induction are used interchangeably. A first sensor or sensing element 50 for sensing changes in magnetic flux, such as a conductive coil, provides measurements of the changes in magnetic flux due to the primary electrical current over a first predetermined area, in this embodiment the area being determined by the sensing element. Thus, as illustrated in FIG. 1, sensing element 50 may comprise a conductive coil having a predetermined cross-sectional area. Likewise, a current source, such as coil 52 coupled to the output terminals of an amplifier or between an output terminal and ground, is provided for generating an electrical current inducing changes in magnetic flux over a second predetermined area to offset the changes in magnetic flux due to the primary current. In FIG. 1, the second predetermined area is illustrated as within the first predetermined area. As illustrated, the current source may comprise a coil 52 coupled or connected to one or more output terminals of an amplifier 60, such as an instrumentation, differential, or operational amplifier, whose input terminals are connected or coupled to sensing element or coil 50. Thus, as illustrated, a current induced by sensor or sensing element 50 for sensing changes in magnetic flux is provided to amplifier 60 and amplified to provide a feedback voltage that induces a feedback current to cancel the changes in magnetic flux due to the primary current. This may be shown or illustrated mathematically as follows. The emf is given by $$e_s = N_s \frac{d}{dt}(\phi_p - \phi_2), \qquad [1]$$

where $\phi_p$ and $\phi_2$ refer to the primary magnetic flux attributed to or due to the primary current over the area of the sensing element 50 and the magnetic flux attributed to or due to the current source or feedback current over the area of the feedback coil, respectively. Thus, $$\phi_2 \alpha N_f I_f$$
$$\phi_p \alpha I \qquad [2]$$

resulting in $$e_s \alpha N_s \dot{I} - N_s N_f \frac{d}{dt} I_f. \qquad [3]$$

Next, requiring $e_s = 0$ in the above relationship provides $$I_f \alpha \frac{I}{N_f}. \qquad [4]$$

Due to the relationship illustrated in equation [4] regarding the primary current and the number of coil turns in the feedback or second coil for cancelling the changes in magnetic flux due to the primary current, a current shunt may be used to divide the current to be sensed. This may be followed by a second division to reduce the current further. Unfortunately, even for the embodiment previously illustrated, an accurate current shunt is sometimes not economic to produce because of the cost of carefully fabricating a shunt with the number of turns to achieve the accuracy of measurement desired. Likewise, temperature variations may introduce accuracy problems for the shunt.

Figure 2:
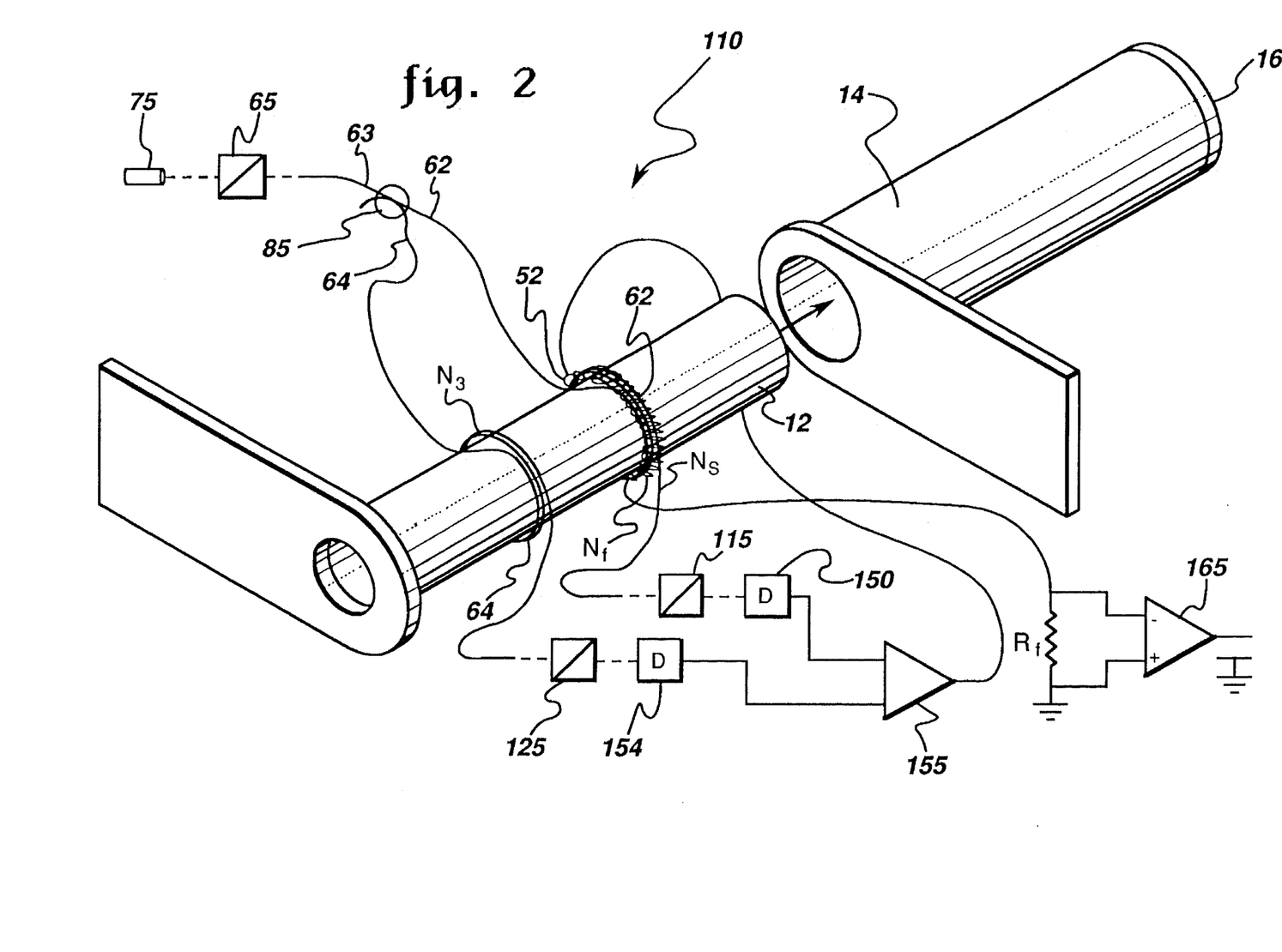
FIG. 2 is a schematic diagram of an embodiment of a reduced magnetic field line integral current sensor in accordance with the invention.

In contrast with the previously described current sensor, a reduced magnetic field line integral current sensor 110 in accordance with the invention, such as the embodiment illustrated in FIG. 2, comprises a first sensor unit or sensing system, such as the sensing system including optical fiber 62, polarizing filter 115, and photodetector 150 for sensing or measuring the line integral of the primary magnetic field along a first predetermined path and a second or reference sensor unit or sensing system, such as the system including optical fiber 64, polarizing filter 125, and photodetector 154, for sensing or measuring the line integral of the primary magnetic field along a second predetermined path. In this particular embodiment, the line integral of the primary magnetic field is measured or sensed by propagating polarized light along an optical fiber or fiber optic cable and measuring the polarization of the light after propagation.

The magnetic field along either predetermined path is largely due to the primary electrical current. Thus, by using a reference sensor unit or sensing system to provide a reference measurement of the line integral of the primary magnetic field along a second predetermined path that is different from the measurement of the line integral of the primary magnetic field along the first predetermined path by a known calibrated amount in relation to the primary current or primary magnetic field, the difference between these two measurements may thereby provide a means or technique for measuring the primary current.

In the context of the invention, a sensing unit refers to a detector or other sensing system whose response is related, at least in part, to the integral of the magnetic induction along a predetermined path. In particular, this type of system includes, but is not limited to, those including optical magnetic field sensors based on the Faraday effect, such as described in, for example, "Faraday Effect Sensors: The State of the Art," by G. W. Day and A. H. Rose, and appearing in *SPIE Vol. 985 Fiber Optic and Laser Sensors VI* (1988). Such optical magnetic field sensors are also described in other texts and publications, such as chapter 6 of *Handbook of Microwave and Optical Components*, Vol. 4, edited by Kai Chang and published by John Wiley & Sons, Inc. (1991). The quantity to be compared by the sensor units described above is a measurement of the line integral of the magnetic field, and is in a general form given by $$\psi = \int \alpha V B \cdot dl \qquad [5]$$

where $\alpha$ is a coefficient that depends on the state of the polarization of the electromagnetic radiation, or in this particular embodiment light, and V is the Verdet coefficient of the medium. The component of the magnetic induction or magnetic flux density B that contributes to this integral is determined in part by the current sensor and sensor unit or system geometry. In equation [5] dl denotes a differential vector along the direction of propagation of the light or electromagnetic radiation and B is a vector representing the magnetic induction. In accordance with the Faraday effect, the magnitude of the magnetic field is determined by measuring the effect of propagation through the magnetic field on the polarization of polarized electromagnetic radiation. It will be appreciated that in the context of the invention the explicit dependence of the line integral of the magnetic field on spatial parameters is omitted for brevity and a more detailed analysis may be performed depending on the particular geometric configuration employed. Furthermore, in the context of the invention, the term light includes visible light, ultraviolet light, and infrared light within the relevant range or frequencies or wavelengths in the electromagnetic spectrum.

As illustrated in FIG. 2, the first and second sensor units each measure the line integral of the primary magnetic field along a predetermined path. Each sensor unit comprises, in this particular embodiment, a waveguide, 62 or 64, such as a single mode fiber optic cable or a low birefringence single mode optical fiber, optically coupled to polarization controlling optics or an optical element, such as, for example, polarizing filters 115 or 125, a liquid crystal cell, a half-wave plate, or a linear polarizer. The polarization controlling optics or optical element is likewise optically coupled to a photodetector, such as photodiode 150 or 154. Likewise, the photodetector may comprise an array of photodetecting elements. Thus, in this particular embodiment, polarized light is propagated through or along a waveguide, such as an optical fiber. The light propagation occuring along or within the primary magnetic field modifies the polarization of the light thereby providing a measure of the line integral of the primary magnetic field along the path of the optical fiber. At the end of the optical fiber or cable, polarization controlling optics, such as polarizing filters 115 or 125, permit some of the polarized light to pass through the filter, while blocking the transmission of other light. Transmitting the polarized light through such filters effectively measures the change in polarization of the light due to propagation along the optical fiber and within the primary magnetic field. Thus, a measure of this change in polarization provides a measure of the line integral of the primary magnetic field along the predetermined path in accordance with equation [5]. The light that successfully traverses the filter or cell is incident upon the photodetector, such as a photodiode. The photodiode then provides a current proportional to the incident light thereby providing a signal related to the desired measurement.

In this particular embodiment of the invention, coil 52 has $N_f$ coil turns and is coupled to the output terminal of amplifier 155, such as a transconductance amplifier, to provide a current source for generating a current inducing a magnetic field to at least partially and even substantially offset the difference between the line integral of the magnetic field associated with the primary current measured by the first sensing unit in FIG. 2, and the line integral of the magnetic field associated with the primary current measured by the second or reference sensing unit in FIG. 2. As illustrated, in the embodiment of FIG. 2, the two sensor units are configured so that a comparison between respective measurements of the line integral of the primary magnetic field along a first predetermined path and second predetermined path may be performed. It is this comparison or difference that is provided to the input terminals of amplifier 155, such as a transconductance amplifier, thereby converting the difference in currents provided by photodetectors 150 and 154 to a voltage output signal from the amplifier output terminal that may then be converted to a feedback current along conductive coil 52, the feedback current providing a measure of the primary electrical current as described hereinafter. Nonetheless, the offset accomplished by generating a current inducing an offsetting magnetic field may alternatively be performed by a number of other techniques, such as conventional signal processing performed by software embedded in a microprocessor.

As illustrated, the difference between the current signal outputs of the first and second sensor units are provided to the input terminals of amplifier 155, such as a transconduction amplifier, in a configuration to provide a voltage output signal that offsets the line integrals measured by the two sensor units. Equation [5] is reminiscent of Ampere's law and for the case of N turns, for example, of a single mode optical fiber wound around the inner conductor of the present invention, such as illustrated in FIG. 2, $$\Psi = \mu\alpha VNI \qquad [6]$$

where I is the primary electrical current carried by the concentric pipe structure illustrated, and $\mu$ is the permeability of the medium. Defining $$\Psi \triangleq \phi N \qquad [7]$$

provides $$\phi = \mu\alpha VI \qquad [8]$$

or, likewise $$\phi = \frac{1}{N} \int \alpha VB dl. \qquad [9]$$

In this embodiment of a reduced magnetic field line integral current sensor in accordance with the invention, the desired primary current measurement may be illustrated mathematically by the following equations; however, it will be appreciated that the explicit dependence of the line integral of the magnetic field on spatial parameters is omitted, as previously discussed. $E_s$ is now given by:

$$e_s = N_s(\Psi_p - \Psi_2) \qquad [10]$$

in place of equation [1]. Likewise, $$\Psi_2 = \mu\alpha VN_f I_f$$

and $$\Psi_p = \mu\alpha VI$$

in accordance with equation [6].
Thus, $$e_s = \mu\alpha V(N_s I - N_s N_f I_f) \qquad [11]$$

Now the condition that $e_s = e_3$, in accordance with the embodiment illustrated in FIG. 2, provides the following equation:

$$\mu\alpha V(N_s I - N_s N_f I_f) = \mu\alpha_3 V_3(N_s - \delta)I \qquad [12]$$

where $$N_3 = N_s - \delta$$

for simplification and to provide the predetermined offset or calibration.
Thus, $$I_f \alpha \frac{\delta I}{N_s N_f}, \qquad [13]$$

where $$\alpha_3 = \alpha$$

and $$V_3 = V$$

for further simplification.

Comparing equation [13] to equation [4] leads to the conclusion that only a small current, $I_f$, relative to the current sensor illustrated in FIG. 1, need be supplied by a current source, because the measurement of the line integral of the magnetic field of the primary current is being reduced by a much smaller value in comparison with the measurement of the time rate of change of magnetic flux in the earlier approach. Thus, a smaller number of ampereturns now being required to accommodate a smaller current, as well as removing the need for a current shunt, results in an economical and desirable current sensor. The feedback current, $I_f$, in coil 52 is proportional to the original or primary current to be sensed and provides an accurate current measure. Likewise, avoiding a current shunt may avoid inaccuracies in the current measurements associated with the temperature dependence of the materials used for the current shunt.

In the embodiment of FIG. 2, the comparison of the measurement of the line integral of the primary magnetic field along two different paths is conveniently configured as illustrated. Polarized light is provided by light source 75 and polarization controlling optics, such as polarizing filter 65. The polarization provided by filter 65 is oriented or calibrated with respect to polarizing filters 115 and 125. This polarized light may then propagate along the waveguide or optical fiber illustrated in FIG. 2. Optical fiber 63 includes a directional coupler 85 which acts as a beam splitter so that light emitted from the same source may be divided along into two components and propagated along optical fibers 62 and 64, as illustrated. Alternatively, two light emitting sources and two polarizers or polarizing filters suitably adjusted for calibration may be employed instead. Likewise, instead of a light source and polarization controlling optics, a laser diode or other source that emits polarized light may be employed. In general, any source of polarized light may be employed. Furthermore, waveguides having other shapes or made of other materials may also prove suitable, such as quartz or glass to name a few.

It will now be appreciated that different embodiments of a reduced magnetic field line integral current sensor are possible and the invention is not limited in scope to the particular embodiments described herein. For example, the invention is not restricted in scope to having the predetermined paths for the sensing units all substantially parallel to the magnetic field. In FIG. 2, this is accomplished by winding optical fibers 62 and 64 around inner cylinder 12 so that the direction of light propagation is substantially parallel to the magnetic field present between the two cylinders, such as described in aforementioned patent application Ser. No. 08/085,790 and patent application Ser. No. 08/085,787. Furthermore, as illustrated in FIG. 2, toroidal feedback coil 52 is placed in the space between the inner surface of cylinder 14 and the outer surface of cylinder 12. This particular configuration exploits and preserves the lack of a magnetic field outside outer cylinder 14 or inside inner cylinder 12. This concentrated magnetic field offers the possibility of enhanced current measurements. In addition, the toroidal coil and optical fibers may be embedded in or wound around a ferromagnetic material, such as ferrite or μ-metal, filling this space between the cylinders to further enhance the magnetic field established.

The direction of propagation may alternatively be oriented to have a predetermined angular profile with respect to the magnetic field other than substantially parallel so long as this orientation or predetermined profile is taken into account with regard to sensing and offsetting the measurements of the line integral of the primary magnetic field. Likewise, coil 52 may be oriented at a predetermined angle with respect to the direction of the magnetic field due to the primary current, such as substantially perpendicular to it. The second or reference sensor unit for sensing the line integral of the primary magnetic field also need not measure the line integral of the primary magnetic field over a path overlapping the path of the first sensing unit or system. In fact, the paths need not bear any particular spatial relationship to one another because no interactions are present between the fibers in contrast to other methods of measuring magnetic fields, such as the mutual inductance approach discussed in connection with FIG. 1. Nonetheless, it may be convenient for coil 52 to generate an offsetting magnetic field along the path of the first sensing system, as illustrated in FIG. 2. Thus, the first sensor unit or sensing system may measure the line integral of the primary magnetic field along a first predetermined path, and the second sensor unit or sensing system may measure the line integral of the magnetic field along a second predetermined path. Likewise, the current source, if provided, may generate a current inducing a magnetic field that at least partially offsets the difference between the line integral of the primary magnetic field measured by the first sensor unit and that measured by the second sensor unit. More specifically, the current source may generate a current inducing a magnetic field that at least partially offsets the line integral of the primary magnetic field measured by the first sensor unit.

Although the previous description indicates that the reference or second sensing unit may provide a measurement of the line integral of the magnetic field due to the primary current a predetermined calibrated amount different from the first sensing unit by employing a different path or an additional path length, such as an additional number of optical fiber turns, as previously described, the invention is not restricted in scope to this approach. For example, instead of using a different or longer path, different wavelengths of light or different materials providing different Verdet coefficients may be employed. In general, any technique may be employed that suitably calibrates the difference in measurements of the line integral of the primary magnetic field, as indicated by the difference in polarization of the propagated light between the first sensing system and the second sensing system, may be employed. Likewise, this predetermined calibrated difference established between the two sensing systems does not require that the magnitude of the line integral of the primary magnetic field measured by the first sensing system exclusively exceed that of the second sensing system or vice-versa, so long as the difference may be calibrated or may be offset, such as by a current source inducing a magnetic field, as previously described.

In alternative embodiments, the reference or second sensing system may be placed in alternative locations in the current sensor. Likewise, additional sensing systems may be introduced to improve the signal obtained and provide additional immunity against external magnetic fields, and hence, more robust measurements. In one alternative embodiment, the sensitivity of the measurements may be improved by employing a light reflector at the end of optical fiber 62 or 64, instead of a polarizing filter and photodetector. By this technique, the path of the propagated light through the primary magnetic field may be effectively doubled. With a directional coupler properly placed in the path of the polarized light now reflected back along the optical fiber towards the source, the reflected light may be directed along the path of another optical fiber segment to a polarizing filter and photodetector to obtain the desired measurement of the line integral of the primary magnetic field. This increase in path length will increase the measurement sensitivity. Furthermore, the use of two separate sensor units or systems may be avoided by a similar technique. A half-silvered mirror or other device may be employed at the end of an optical fiber to transmit a portion of the propagated light and reflect the remaining portion of the propagated light back towards the source along the optical fiber. The polarization of the transmitted portion of the propagated light may be measured. Likewise, the polarization after reflection and propagation back towards the source of the remaining portion of the propagated light may be measured as previously described. Thus, one optical fiber or fiber optic cable may be employed to provide measurements of the line integral of the primary magnetic field along two predetermined paths, the two measurements having a predetermined calibrated difference in relation to the primary current to obtain the desired primary current measurement.

Likewise, the current source for generating a current to induce an offsetting magnetic field, as previously described, may be implemented a number of ways. For example, a transconductance amplifier may be employed that converts current, such as the current provided by the output signals of the first and second sensor units, to voltage. This may be conventionally implemented by an operational amplifier or instrumentation amplifier coupled to a buffer amplifier. Likewise, other conventional embodiments may be employed, such as described in *Modern Electronic Circuits Reference Manual*, by John Markus and available from the McGraw-Hill Book Company (1980) or in *IC Op-Amp Cookbook*, 3d Ed., by Walter C. Jung, and available from MacMillian, Inc. (1993).

A reduced magnetic field line integral current sensor in accordance with the present invention has a number of advantages. First, as previously suggested, there is substantially no magnetic field inside the inner cylinder or outside the outer cylinder of the two cylinders where that embodiment is employed. This is particularly advantageous for metering applications, where, as previously discussed, several current sensors are employed in close proximity to each other, such as in a three-phase network. Likewise, this avoids the need for magnetic insulation which is undesirable and, furthermore, may not provide effective insulation in the presence of magnetic fields having a strong DC component which may saturate the insulating material. Yet another advantage is that the current sensor is relatively insensitive to external magnetic fields, such as the magnetic field due to the conductors to the current source and other sources of noise. In particular, to significantly affect the current measurements the magnetic field should be substantially circularly radially symmetric, which is unlikely. This occurs at least in part because the paths associated with sensor units or sensing systems for sensing the line integral of the primary magnetic field may be oriented substantially parallel to the direction of a primary magnetic field substantially uniform in angular direction so that the dot product of these external fields with the direction of the propagation path may be reduced. It may be demonstrated that the current sensor is not only insensitive to uniform external magnetic fields, but also uniform temperature effects. External magnetic field gradients and temperature gradients may also be corrected with conventional digital signal processing techniques. Thus, the effect of noise on this type of feedback configuration is at least no worse and possibly better than other alternative types of current sensor configurations, such as the aforementioned U.S. Pat. No. 5,066,904 or even the feedback configuration described in patent application Ser. No. 08/085,789. The embodiment illustrated in FIG. 2 should also be contrasted with the case illustrated in FIG. 1 where the time rate of change of the magnetic flux was detected using coils and conductive loops. Measuring the time derivative of the magnetic flux eliminates the measurement of DC magnetic fields. By way of contrast, the appropriate comparison for a reduced magnetic field line integral in accordance with the present invention is based on the measurement of values depicted by equation [5], and, therefore, permits the measurement of DC as well as AC magnetic fields.

Yet another advantage of a reduced magnetic field line integral current sensor in accordance with the invention is that because the magnetic field is concentrated in the space or the predetermined radial distance or separation between the outer surface of the outer pipe and the inner surface of the inner pipe, where an inner pipe is used, accuracy is improved while simplifying the current sensor structure and making it relatively easy to manufacture. As previously discussed, this accuracy may be improved further by the use of a toroidal feedback coil with a ferromagnetic material. Furthermore, sensing units may be employed having waveguides inserted at arbitrary locations between the outer pipe and an inner cylindrical conductive element or pipe, thus providing a better measurement of the current due to the improved signal obtained.

An embodiment of a reduced magnetic field line integral current sensor in accordance with the invention may also be made to accommodate at least two other current sensing schemes, such as those described in patent application Ser. No. 08/085,790 and in patent application Ser. No. 08/085,787, effectively providing three current measurement techniques in one device. As illustrated in FIG. 2, current sensor 110 comprises a pair of concentric hollow cylinders or pipes, 12 and 14, electrically connected by a washer 16, thus enabling the noninductive shunt current sensor as described in patent application Ser. No. 08/085,787. Likewise, a coil 52, is provided in the space between the outer surface of pipe 12 and the inner surface of pipe 14. This coil may be employed in a mutually inductive current sensing scheme with a magnetic field substantially uniform in angular direction, such as described in patent application Ser. No. 08/085,790. Finally, the first and second sensor units, illustrated in FIG. 2, provide a reduced magnetic field line integral current sensor in accordance with the invention. Nonetheless, it will now be appreciated that although offering a convenient embodiment, a reduced magnetic field line integral current sensor in accordance with the invention is not restricted to the configuration including concentric pipes or hollow cylinders previously discussed. Yet even for such other embodiments of a reduced magnetic field line integral current sensor in accordance with the invention, such a current sensor avoids the need for a current shunt thus removing inaccuracies due to temperature variations and reducing the expense of the current sensor, as previously suggested. Furthermore, by comparing the polarization imparted to the propagated light by two sensing units, as previously described, a current sensor in accordance with the invention utilizing sensors based on the Faraday effect to measure the line integral of the primary magnetic field may offset potential noise sources due to polarization that may typically be present when employing only a single such sensing unit.

Figure 3:
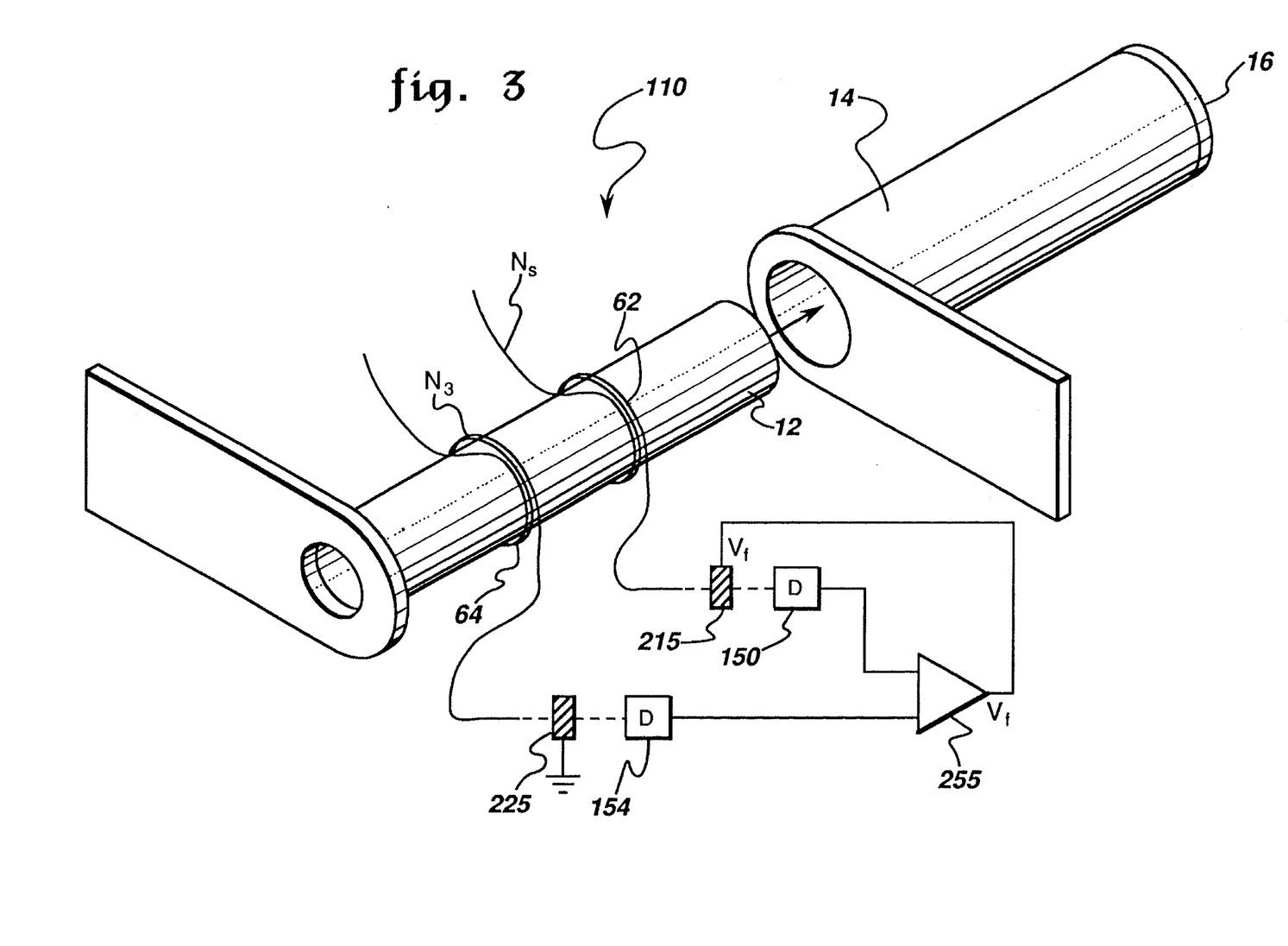
FIG. 3 is a schematic diagram of an alternative embodiment of a reduced magnetic field line integral current sensor in accordance with the invention.

Another embodiment of a reduced magnetic field line integral current sensor in accordance with the invention is illustrated in FIG. 3. The source of polarized light has been omitted for convenience. This embodiment is similar to the embodiment illustrated in FIG. 2 although, in place of polarizers 115 and 125, liquid crystal cells 215 and 225 provide the polarization controlling optics. Furthermore, because of the introduction of liquid crystal cells in place of polarizers or polarizing filters, a current source for generating an offsetting magnetic field is omitted from this particular embodiment. It will be appreciated that even for other embodiments, the invention is not restricted in scope to employing a current source to offset the calibrated difference between the two sensor units. Many other techniques, such as the one illustrated in FIG. 3, may be employed. As illustrated, in this embodiment photodetectors 150 and 154 provide current signals to transconductance amplifier 255 which provides a voltage output signal as feedback to liquid crystal cell 215. As illustrated, liquid crystal cell 225 is grounded. Thus, instead of using the feedback current to induce an offsetting magnetic field, in this particular embodiment a feedback voltage drives or controls the polarizing effect of liquid crystal cell 215. Thus, this feedback voltage provides a measurement of the primary current.

This embodiment has several advantages over the embodiment illustrated in FIG. 2. First, significantly less current is generated in this embodiment in comparison with the embodiment in FIG. 2. Likewise, through the use of a grounded liquid crystal cell with photodetector 154 this embodiment also has the desirable feature of providing an implicit correction for temperature variations that may degrade the quality of the measurements obtained. More specifically, as variations in temperature affect the operation of liquid crystal cell 215, likewise, these temperature variations affect the operation of liquid crystal cell 225. Thus, due to the difference or comparison of output signals by amplifier 255, these temperature variations are removed from the ultimate primary current measurement obtained. Alternatively, a polarizer may be used in place of liquid crystal cell 225, although in such an embodiment the advantage regarding the offsetting of temperature variations will not be present.

Otherwise, the operation of this particular embodiment is similar to the embodiment illustrated in FIG. 2. Polarized light may be provided using a source, polarizing filter, and a directional coupler or, alternatively, two polarized light sources may be employed. The polarized light may be propagated along a waveguide, such as optical fibers 62 and 64, wound around inner conductor or conductive cylinder 12. Likewise, the propagated light is transmitted or further propagated through liquid crystal cells 215 and 225, in contrast with polarizers 115 and 125 illustrated in FIG. 2. In both embodiments, these filters or cells provide the polarization controlling optics, although the invention is not restricted in scope to only employing these polarization controlling techniques. Likewise, the light emitted by or successfully transmitted through the polarization controlling optics is incident upon a photodetector, such as photodiodes 150 and 154. Again, other photodetectors or an array of photodetectors may be employed.

A method of measuring a primary electrical current inducing a primary magnetic field at least defined over a known region may be performed in the following manner. The line integral of the magnetic field due to the primary current, or the primary magnetic field, along a first predetermined path within the known region is sensed or measured. The line integral of the primary magnetic field may be sensed as follows: polarized light is propagated in a direction oriented with respect to the primary magnetic field, such as along a waveguide propagating the light substantially parallel to the primary magnetic field, and any change in polarization after propagation is measured. The line integral of the magnetic field due to the primary current along a second predetermined path within the known region may also be sensed or measured. As previously discussed, the line integral of the magnetic field due to the primary current along two predetermined paths is sensed so that the line integral of the primary magnetic field measured or sensed along the first path is a predetermined calibrated amount different from the line integral of the primary magnetic field measured or sensed along the second path. A current may then be generated inducing a magnetic field to at least partially or even substantially offset the difference between the line integral of the primary magnetic field measured or sensed along the first path and the line integral of the primary magnetic field measured or sensed along the second path. The current may be generated, as previously described, by a feedback coil coupled to the output terminals of an amplifier, such as a transconduction amplifier. Alternatively, instead of generating a current to induce an offsetting magnetic field, a feedback voltage may be generated to drive an electrooptic device, such as a liquid crystal cell, to at least partially offset the difference in polarization due to the propagation of the light along the two different paths. The invention is not restricted in scope to having the magnitude of the line integral of the primary magnetic field sensed along the first path exceed or be less than the magnitude of the line integral of the primary magnetic field sensed along the second path. Thus, it is sufficient that the sensed difference in the line integrals of the primary magnetic field be an amount that may be suitably calibrated. As previously discussed, different wavelengths of light, different waveguide materials or different length paths, for example, may be employed. Likewise, upon generating the voltage or the current either to drive an electrooptic device and thereby modify the polarization of the incident light or to induce a magnetic field to at least partially or even substantially offset the difference between the line integrals of the primary magnetic field sensed or measured along the first path and the second path, the generated electrical feedback signal, either voltage or current, may be measured. For example, a conventional operational amplifier configuration, such as amplifier 165 having a resistor $R_f$ coupled across its input terminals as illustrated in FIG. 2, may be employed to measure the feedback current. Likewise, this measurement of the current generated may be converted into a measurement of primary current, such as indicated by equation [13]. Furthermore, where a feedback current is generated, it may be desirable to have the first predetermined path oriented substantially parallel to both the magnetic field induced by the primary current and the magnetic field induced by the feedback current, such as illustrated in FIG. 2. Nonetheless, in the different embodiments, various angles or orientations between the primary magnetic field and the direction of light propagation may be accommodated so long as this is included in any calibration or adjustments performed, such as by signal processing.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A current sensor for measuring a primary electrical current inducing a primary magnetic field having a magnetic flux density at least defined over a known region comprising:

a first sensor unit for measuring the line integral of the primary magnetic field along a first predetermined path within the known region; and a second sensor unit for measuring the line integral of the primary magnetic field along a second predetermined path within the known region, the line integral of the primary magnetic field along the second path measured by said second sensor unit being a predetermined calibrated amount different from the line integral of the primary magnetic field along the first path measured by said first sensor unit.

2. The current sensor of claim 1, and further comprising a current source for generating a current inducing a magnetic flux density to at least partially offset the difference between the line integral of the primary magnetic field along the first path measured by said first sensor unit and the line integral of the primary magnetic field along the second path measured by said second sensor unit.

3. The current sensor of claim 1, wherein the magnitude of the line integral of the primary magnetic field said first sensor unit is adapted to measure exceeds the magnitude of the line integral of the primary magnetic field said second sensor unit is adapted to measure.

4. The current sensor of claim 1, wherein the magnitude of the line integral of the primary magnetic field said second sensor unit is adapted to measure exceeds the magnitude of the line integral of the primary magnetic field said first sensor unit is adapted to measure.

5. The current sensor of claim 2, wherein said first sensor unit comprises a photodetector, polarization controlling optics, and a waveguide;

and further comprising a source of polarized light optically coupled to said waveguide so that said waveguide receives light emitted by said source;

said photodetector being optically coupled to said waveguide by said polarization controlling optics so as to receive light emitted by said source, propagated through said waveguide, and transmitted through said polarization controlling optics.

6. The current sensor of claim 5, wherein said waveguide propagates light received from said source along a path oriented at a substantially predetermined angular profile with respect to the direction of the primary magnetic field.

7. The current sensor of claim 6, wherein the predetermined angular profile of said waveguide constitutes an angular profile substantially parallel to the direction of the primary magnetic field.

8. The current sensor of claim 2, wherein said current source comprises a conductive coil coupled to an output terminal of an amplifier so as to receive a voltage output signal provided by said amplifier, said coil having a cross-sectional area oriented at a predetermined angle with respect to the direction of the primary magnetic field.

9. The current sensor of claim 8, wherein said conductive coil has a cross-sectional area oriented substantially perpendicular with respect to the direction of the primary magnetic field.

10. The current sensor of claim 8, wherein each respective sensor unit of the two sensor units comprises a photodetector, polarization controlling optics, and a waveguide;

in each respective sensor unit the photodetector being optically coupled to the waveguide by the polarization controlling optics;

the photodetectors of the two sensor units being coupled in an offsetting configuration across the input terminals of said amplifier.

11. The current sensor of claim 5, wherein said polarization controlling optics comprises a linear polarizer.

12. The current sensor of claim 5, wherein said waveguide comprises an optical fiber.

13. The current sensor of claim 12, wherein said optical fiber comprise a single mode optical fiber.

14. The current sensor of claim 5, wherein said photodetector comprises a photodiode.

15. The current sensor of claim 1, wherein said first sensor unit comprises a photodetector, polarization controlling optics, and a waveguide;

and further comprising a polarized light source optically coupled to said waveguide so that said waveguide receives light omitted by said source;

said photodetector being optically coupled to said waveguide by said polarization controlling optics so as to receive light emitted by said source, propagated through said waveguide, and transmitted through said polarization controlling optics;

said polarization controlling optics comprising a voltage signal driven liquid crystal cell.

16. The current sensor of claim 15, wherein said photodetector provides a current in response to the light received;

and further comprising a transconductance amplifier;

said transconductance amplifier being coupled to said photodetector and providing a voltage output signal in response to the current provided by said photodetector;

said voltage driven liquid crystal cell being coupled to said transconductance amplifier to receive the amplifier voltage output signal and be responsive thereto.

17. The current sensor of claim 10, wherein said waveguide comprises an optical fiber, and further comprising:

two concentric pipes, each having a first end, a second end, an inner surface, an outer surface;

the respective second ends of said pipes being electrically connected by a conductive bridge to form a connected conductive path between the first end of the inner pipe and the first end of the outer pipe;

and wherein the outer surface of the inner pipe being spaced a predetermined radial distance from the inner surface of the outer pipe;

said optical fiber being wound around the inner pipe and being located in the space between the inner surface of the outer pipe and the outer surface of the inner pipe.

18. The current sensor of claim 10, wherein said waveguide comprises an optical fiber, and further comprising:

two concentric pipes, each having a first end, a second end, an inner surface, an outer surface;

the respective second ends of said pipes being electrically connected by a conductive bridge to form a connected conductive path between the first end of the inner pipe and the first end of the outer pipe;

the outer surface of the inner pipe being spaced a predetermined radial distance from the inner surface of the outer pipe;

said conductive coil comprising a toroidal coil having a plurality of coil loops, said toroidal coil being located in the space between the inner surface of the outer pipe and the outer surface of the inner pipe;

said optical fiber being wound around the inner pipe and being located in the space between the inner surface of the outer pipe and the outer surface of the inner pipe;

said optical fiber being surrounded by the coil loops of said toroidal coil.

19. A method of measuring a primary electrical current inducing a primary magnetic field at least defined over a known region, said method comprising the steps of:

sensing the line integral of the primary magnetic field along a first predetermined path within the known region; and sensing the line integral of the primary magnetic field along a second predetermined path within the known region, the line integral of the primary magnetic field sensed along the first path being a predetermined calibrated amount different from the line integral of the primary magnetic field sensed along the second path.

20. The method of claim 19, and further comprising the step of generating a current inducing a magnetic field to at least partially offset the difference between the line integral of the primary magnetic field sensed along the first path and the line integral of the primary magnetic field sensed along the second path.

21. The method of claim 19, wherein the magnitude of the line integral of the primary magnetic field sensed along the second predetermined path exceeds the magnitude of the line integral of the primary magnetic field sensed along the first predetermined path.

22. The method of claim 19, wherein the magnitude of the line integral of the primary magnetic field sensed along the first predetermined path exceeds the magnitude of the line integral of the primary magnetic field sensed along the second predetermined path.

23. The method of claim 20, wherein the generating step includes the step of measuring the current generated.

24. The method of claim 23, and further comprising the step of converting the measurement of the current generated into a measurement of the primary current.

25. The method of claim 19, wherein at least one of the steps of sensing the line integral of the primary magnetic field comprises the steps of:

propagating polarized light through the primary magnetic field along a predetermined path; and measuring any change in polarization of the propagated light.

26. The method of claim 25, and further comprising the step of generating an electrical signal to drive an electrooptic device in the path of said propagated light, said generated electrical signal driving said electrooptic device so as to at least partially offset any measured change in polarization of the propagated light.

* * * * *